United States Patent [19]
Uno et al.

[11] Patent Number: 5,241,228
[45] Date of Patent: Aug. 31, 1993

[54] UHF TRANSISTOR MIXER CIRCUIT

[75] Inventors: Masao Uno; Takashi Hiroshima, both of Nagaokakyo, Japan

[73] Assignee: Murata Manufacturing Co., Ltd., Japan

[21] Appl. No.: 573,455

[22] Filed: Aug. 27, 1990

[30] Foreign Application Priority Data

Aug. 28, 1989 [JP] Japan .................. 1-221061

[51] Int. Cl.⁵ .................. H03D 13/00; H03K 9/06
[52] U.S. Cl. .................. 307/529; 307/271; 455/333; 328/15; 328/156
[58] Field of Search .............. 307/529, 271; 328/156, 328/15; 455/333

[56] References Cited

U.S. PATENT DOCUMENTS

| | | | |
|---|---|---|---|
| 3,716,730 | 2/1973 | Cerny, Jr. | 307/529 |
| 3,863,136 | 1/1975 | Hanson | 307/529 |
| 4,308,473 | 12/1981 | Carnes | 307/529 |
| 4,684,833 | 8/1987 | Rinderle | 328/156 |
| 4,845,389 | 8/1989 | Pyndiah et al. | 307/529 |
| 4,850,039 | 7/1989 | Materspaugh | 455/333 |
| 5,043,609 | 8/1991 | Uno et al. | 307/529 |

Primary Examiner—Timothy P. Callahan
Attorney, Agent, or Firm—Ostrolenk, Faber, Gerb & Soffen

[57] ABSTRACT

A UHF transistor mixer circuit includes a transistor having a base to which an inputted high-frequency signal and a local oscillation signal are inputted. A bias voltage is applied to the base from a direct current voltage source through an inductor constructed with a microstripline. A low-pass filter which prevents signal components in the UHF band from being passed therethrough is provided between the base and the voltage source, and more particularly between the inductor and the direct current voltage source. The local oscillation signal is prevented from flowing toward the direct current voltage source by the low-pass filter, and therefore, the intermodulation distortion of the mixer circuit can be improved.

20 Claims, 1 Drawing Sheet

F I G. 1
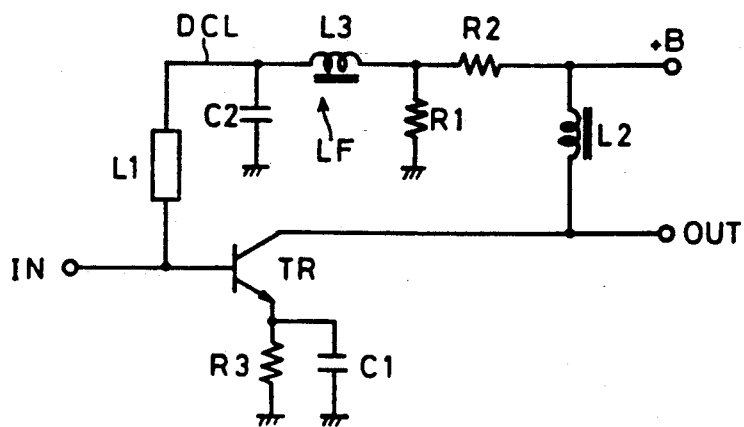
F I G. 2
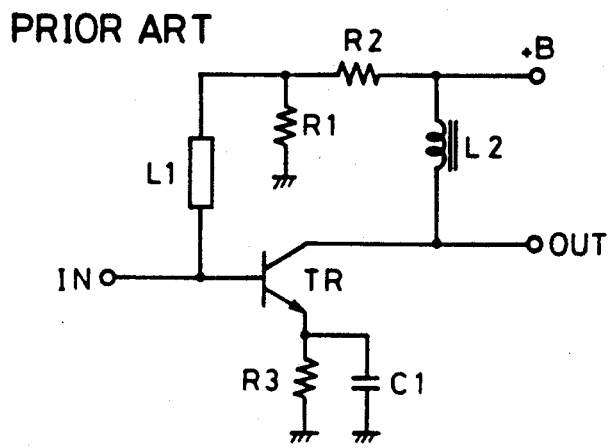
F I G. 3
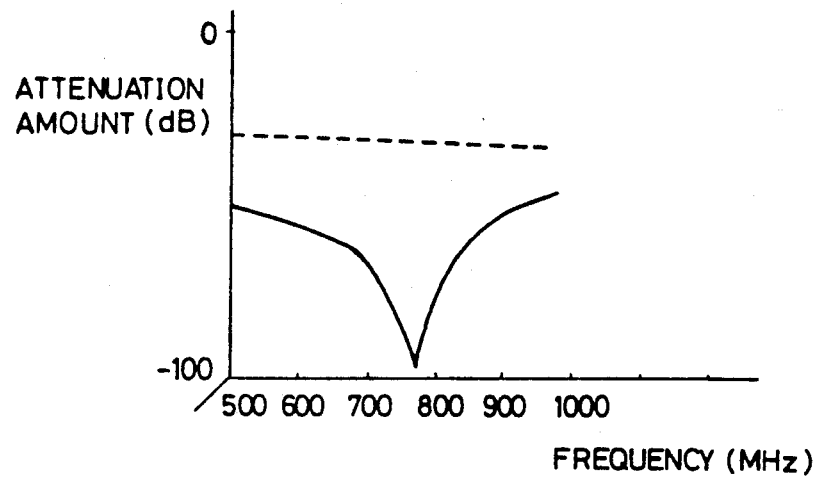

UHF TRANSISTOR MIXER CIRCUIT

BACKGROUND OF THE INVENTION

1. Field of the Invention

The present invention relates to a UHF transistor mixer circuit. More specifically, the present invention relates to a UHF transistor mixer circuit which includes a transistor, a bias voltage from a direct current voltage source being supplied to the base of the transistor through an inductor constructed with a microstripline, and an inputted high-frequency signal and a local oscillation signal being inputted to the base.

1. Description of the Prior Art

A conventional mixer circuit is shown in FIG. 2. With reference to FIG. 2, a high-frequency signal and a local oscillation signal are inputted through an input terminal IN to a mixer circuit. The high-frequency signal is outputted by a high-frequency amplifying circuit (not shown) and has a frequency of 810–835 MHz, for example. The local oscillation signal is outputted by a local oscillating circuit (not shown) and has a frequency of 720–745 MHz, for example. The two signals are inputted to a base of a transistor TR via the input terminal IN. A voltage obtained by voltage-dividing a direct current voltage +B by means of resistors R1 and R2 is applied as a bias voltage to the base of the transistor TR via an inductor L1 constructed by a microstripline. The inductor L1 becomes a high-impedance with respect to the signals to be inputted to the base of the transistor TR, that is, the high-frequency signal, and the local oscillation signal so as to prevent the respective inputted signals from flowing toward the direct current voltage source +B.

An emitter resistor R3 and a bypass capacitor C1 connected in parallel between each other are connected to an emitter of the transistor TR and ground. A collector of the transistor TR is connected to an output terminal OUT of the mixer circuit, and the output terminal OUT, i.e. the collector of the transistor TR, is connected to the direct current voltage source +B via a choke coil L2.

In the mixer circuit shown in FIG. 2, an intermediate frequency signal having a frequency equal to the difference between the inputted high-frequency signal and the local oscillation signal is outputted from the collector of the transistor TR, i.e. the output terminal OUT.

One of the important elements which determine the performance of such a UHF transistor mixer circuit is the intermodulation distortion, and it is desired that the intermodulation distortion be as small as possible. In order to make the intermodulation distortion small, it is necessary to prevent the local oscillation signal from flowing toward the direct current voltage source +B in a case where the injected level of the local oscillation signal to the base of the transistor TR is constant. However, in the conventional UHF transistor mixer circuit shown in FIG. 2, even though the inductor L1 composed of a microstripline is inserted, the degree of improvement of the intermodulation distortion is insufficient, because the local oscillation signal flows toward the direct current voltage source +B through the inductor L1.

SUMMARY OF THE INVENTION

Therefore, a principal object of the present invention is to provide a novel UHF transistor mixer circuit.

Another object of the present invention is to provide a UHF transistor mixer circuit in which the intermodulation distortion can be improved.

A UHF transistor mixer circuit in accordance with the present invention comprises: a transistor having a base to which a high-frequency signal and a local oscillation signal are inputted; a direct current voltage source; an inductor constructed with a microstripline and connected between the direct current voltage source and the base; and filter means connected between the direct current voltage source and the base for preventing the local oscillation signal from flowing toward the direct current voltage source.

Since the filter means prevents frequency components in the UHF band including the local oscillation signal from passing therethrough, the local oscillation signal applied to the base of the transistor is prevented from flowing toward the direct current voltage source by both of the inductor and the filter means. Therefore, the injected level of the local oscillation signal to the base of the transistor is prevented from being lowered, and therefore, the intermodulation distortion can be reliably improved.

These objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 1 is a circuit diagram showing one embodiment in accordance with the present invention.

FIG. 2 is a circuit diagram showing one example of a conventional UHF transistor mixer circuit.

FIG. 3 is a graph showing the operation of the embodiment of the present invention, wherein the ordinate indicates frequency and the abscissa indicates the amount of attenuation of a UHF signal at the direct current voltage source line.

DETAILED DESCRIPTION OF THE PREFERRED EMBODIMENTS

A UHF transistor mixer circuit of one embodiment in accordance with the present invention shown in FIG. 1 is similar to the conventional UHF transistor mixer circuit shown in FIG. 2 except for the following points, and therefore, a duplicate detailed description thereof will be omitted by applying the same reference symbols to the same or similar portions in the respective figures.

More specifically, in the FIG. 1 embodiment, a low-pass filter LF is provided between the base of the transistor TR and the direct current voltage source +B. The low-pass filter LF is a T-type filter which prevents frequency components in the UHF band including the high-frequency signal and the local oscillation signal from passing therethrough. The low-pass filter LF includes an inductor L3 inserted in a direct current voltage source line DCL between the inductor L1 and the resistor R2, and a capacitor C2 connected between one end of the inductor L3 and ground.

Since the low-pass filter LF prevents the frequency components in the UHF band including the local oscillation signal from passing therethrough, the local oscillation signal injected into the base of the transistor TR is prevented from flowing toward the direct current voltage source +B.

Referring now to FIG. 3 the amount of attenuation of the UHF band signal at the direct current source line DCL in the conventional circuit is shown by a dotted line, and a solid line shows the attenuation amount of the UHF band signal at the direct current voltage source line DCL of the FIG. 1 embodiment. As well seen from FIG. 3, the local oscillation signal is drastically attenuated by the low-pass filter LF at the direct current voltage source line DCL in comparison with the conventional circuit, and therefore, the flow of the local oscillation signal toward the direct current voltage source +B can be prevented.

In addition, in experimentation by the inventors and others, the intermodulation distortion [dB] was drastically improved in comparison with the prior art as shown in the following table. In addition, in the table, differences of the intermodulation distortions from the desired levels thereof are indicated in a case where local oscillation signals in a frequency band of 720-745 MHz are used. Therefore, the larger such differences, the better the performance.

TABLE

| High-frequency signal [MHz] | FIG. 1 circuit | FIG. 2 circuit |
| --- | --- | --- |
| 810 | 66.8 | 59.8 |
| 815 | 68.9 | 59.0 |
| 820 | 67.8 | 59.2 |
| 825 | 67.4 | 60.2 |
| 830 | 67.5 | 59.7 |
| 835 | 67.1 | 59.9 |

In the above described embodiment, the filter LF connected between the base of the transistor TR and the direct current voltage source +B is a low pass filter. However, alternatively, a band elimination filter having a frequency band equal to the local oscillation frequencies may be inserted in such a direct current voltage source line DCL. Furthermore, a filter of either type may be inserted between the inductor L1 and the base of the transistor TR. However, in any case, it is necessary for the filter means not to prevent the direct current voltage +B, that is, a bias voltage, from being applied to the base of the transistor TR.

Although an embodiment of the present invention has been described and illustrated in detail, it is clearly understood that the same is by way of illustration and example only and is not to be taken by way of limitation, the spirit and scope of the present invention being limited only by the terms of the appended claims.

We claim:

1. A UHF transistor mixer circuit, comprising:
    a transistor having a base to which an inputted high-frequency signal and a local oscillation signal are inputted, said transistor further having a collector connected to an output terminal and an emitter connected to a reference potential;
    a direct current voltage source; and
    a first inductor and filter means connected in series between said direct current voltage source and said base of said transistor, said first inductor being constructed with a microstripline, and said filter means preventing said local oscillation signal from flowing toward said direct current voltage source and allowing a bias voltage to be applied from said direct current voltage source to said base.

2. A UHF transistor mixer circuit in accordance with claim 1, wherein said filter means includes a second inductor and a capacitor connected thereto, and said first inductor and said second inductor are connected in series between said direct current voltage source and said base.

3. A UHF transistor mixer circuit in accordance with claim 2, wherein said filter means includes a low-pass filter.

4. A UHF transistor mixer circuit in accordance with claim 2, wherein said filter means includes a T-type filter.

5. A UHF transistor mixer circuit in accordance with claim 2, wherein said capacitor is connected between said second inductor and ground.

6. A UHF transistor mixer circuit in accordance with claim 5, wherein said capacitor is connected to a junction between said first and second inductors.

7. A UHF transistor mixer circuit in accordance with claim 2, wherein said capacitor is connected to a junction between said first and second inductors.

8. A transistor mixer circuit comprising:
    a transistor having a base connected to an input terminal for receiving an input signal and a local oscillator signal having respective predetermined frequency ranges;
    a bias input terminal for receiving a direct current bias voltage from a direct current voltage source;
    a first inductor and a filter connected in series between said base of said transistor and said bias terminal, said filter having a frequency response range selected for preventing signals in the frequency range of said local oscillator signal from flowing toward said bias input terminal, and for allowing said direct current bias voltage to be applied to said base of said transistor;
    said transistor having a collector connected to an output terminal and an emitter connected to a reference potential.

9. A transistor mixer circuit in accordance with claim 8, wherein said filter is a low-pass filter.

10. A transistor mixer circuit in accordance with claim 8, wherein said filter comprises a capacitor and a second inductor.

11. A transistor mixer circuit in accordance with claim 10, wherein said filter is connected between said first inductor and said bias input terminal.

12. A transistor mixer circuit in accordance with claim 11, wherein said second inductor is connected between said first inductor and said bias input terminal.

13. A transistor mixer circuit in accordance with claim 12, wherein said capacitor is connected between said second inductor and ground.

14. A transistor mixer circuit in accordance with claim 13, wherein said capacitor is connected to a junction between said first and second inductors.

15. A transistor mixer circuit in accordance with claim 8, wherein said filter is a T-type filter.

16. A transistor mixer circuit in accordance with claim 8, wherein said first inductor comprises a microstripline.

17. A transistor mixer circuit in accordance with claim 8, wherein said signals are UHF signals.

18. A transistor mixer circuit comprising:
    a transistor having a base connected to an input terminal for receiving an input signal and a local oscillator signal having respective predetermined frequency ranges;
    a bias input terminal for receiving a direct current bias voltage from a direct current voltage source;
    a filter connected between said base of said transistor and said bias terminal, said filter having a frequency response range selected for preventing signals in the frequency range of said local oscillator signal from flowing toward said bias input terminal, and for allowing said direct current bias voltage to be applied to said base of said transistor; said transistor having a collector connected to an output terminal and an emitter connected to a reference potential.

19. A transistor mixer circuit in accordance with claim 18, wherein said filter is a T-type filter.

20. A transistor mixer circuit in accordance with claim 18, wherein said filter is a low-pass filter.

* * * * *